United States Patent
Maldei et al.

(10) Patent No.: US 6,960,523 B2
(45) Date of Patent: Nov. 1, 2005

(54) METHOD OF REDUCING EROSION OF A NITRIDE GATE CAP LAYER DURING REACTIVE ION ETCH OF NITRIDE LINER LAYER FOR BIT LINE CONTACT OF DRAM DEVICE

(75) Inventors: Michael Maldei, Durham, NC (US); Prakash C. Dev, Plano, TX (US); David Dobuzinsky, New Windsor, NY (US); Johnathan Faltermeier, LaGrange, NY (US); Thomas S. Rupp, Faak am See (AT); Chienfan Yu, Highland Mills, NY (US); Rajesh Rengarajan, Poughkeepsie, NY (US); John Benedict, New Paltz, NY (US); Munir-ud-Din Naeem, Poughkeepsie, NY (US)

(73) Assignees: Infineon Technolgies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/406,645

(22) Filed: Apr. 3, 2003

(65) Prior Publication Data

US 2004/0195607 A1 Oct. 7, 2004

(51) Int. Cl.⁷ ................. H01L 21/4763; H01L 21/3205

(52) U.S. Cl. ....................... 438/639; 438/592; 438/595; 438/631; 438/636

(58) Field of Search ................................ 438/184, 230, 438/265, 303, 523, 533, 386, 592, 595, 597, 631, 632, 636–640; 257/382, 383, 410–413, 900

(56) References Cited

U.S. PATENT DOCUMENTS

| 6,165,839 A | * | 12/2000 | Lee et al. ................... 438/253 |
| 6,221,714 B1 | * | 4/2001 | Jang ........................... 438/241 |
| 2002/0030234 A1 | * | 3/2002 | Ohuchi et al. .............. 257/383 |

* cited by examiner

Primary Examiner—Hung Vu
(74) Attorney, Agent, or Firm—Slater & Matsil, L.L.P.

(57) ABSTRACT

An etch rate of a nitride liner layer is improved relative to an etch rate of a nitride cap layer. The nitride liner layer is located at an exposed portion of a substrate adjacent to a stacked structure also located atop the substrate. The nitride cap layer is located atop the stacked structure. An oxide spacer is formed along sidewalls of the stacked structure. The nitride liner layer is patterned and etched to form at least one opening therein to the substrate while the nitride cap layer remains substantially intact.

15 Claims, 6 Drawing Sheets

METHOD OF REDUCING EROSION OF A NITRIDE GATE CAP LAYER DURING REACTIVE ION ETCH OF NITRIDE LINER LAYER FOR BIT LINE CONTACT OF DRAM DEVICE

BACKGROUND OF THE INVENTION

The present invention is directed to memory devices and, more particularly, to the fabrication of dynamic random access memory (DRAM) structures in a substrate.

Semiconductor dynamic random access memory devices (DRAMs) typically include a memory cell array region formed of a plurality of memory cells arranged in rows and columns and include a plurality of bit lines as well as a plurality of word lines that intersect the bit lines. Each memory cell of the array is located at the intersection of a respective word line and a respective bit line and includes a capacitor for storing data and a transistor for switching, such as a planar or vertical MOS transistor. The word line is connected to the gate of the switching transistor, and the bit line is connected to the source or drain of the switching transistor. When the transistor of the memory cell is switched on by a signal on the word line, a data signal is transferred from the capacitor of the memory cell to the bit line connected to the memory cell or from the bit line connected to the memory cell to the capacitor of the memory cell.

When data stored in one of the memory cells is read onto one of the bit lines, for example, a potential difference is generated between the bit line of the respective memory cell and the bit line of another memory cell which form a bit line pair. A bit line sense amplifier located in a support region of the DRAM and connected to the bit line pair senses and amplifies the potential difference and transfers the data from the selected memory cells to a data line pair.

The storage capacitors of the DRAMs are typically formed in deep trenches etched into the substrate. A plurality of layers of conductive and insulating materials is deposited in the deep trenches to produce the storage capacitor. The transistors of the DRAM are generally planar devices that are formed in the substrate, or in a subsequently formed layer, and are located at the side of the storage capacitor. Alternatively, the transistors of the DRAM are disposed vertically, directly above the storage capacitor in the upper part of the trench, which conserves surface area as well as allows for the formation of smaller sized transistors, resulting in the more DRAM cells being placed on a single chip.

An advantage of DRAMs over other types of memory technology is their low cost because of the simplicity and scaling characteristics of the memory cell. Though the DRAM memory cell is based on simple concepts, the actual design and implementation of such cells typically requires a highly complex DRAM design and process technology.

Part of the complexity in the manufacturing process of a DRAM is the difficulty of providing practical and repeatable selective etch processes, such as when a material is to be removed from a region of the DRAM while the same or another material that is located atop another region of the DRAM is to be left relatively intact. An example of such a process step is the contact-to-bit line (CB) etching step in which a nitride liner material located atop the source and/or drain region is etched. At the same time that the nitride liner layer is etched, the nitride cap atop the word line stack above the gate region must remain relatively intact to prevent electrical shorts between the word line and the bit line. However, the nitride liner layer etches at a relatively slow rate, whereas the nitride cap atop the word line stack etches at a much faster rate so that a significant portion of the relatively thick nitride cap is removed at the same time that the relatively thin nitride liner layer is etched. It is therefore difficult to obtain repeatable etching conditions that remove the thin nitride liner layer without risking exposure of the word line stack caused by removal of the nitride cap.

It is therefore desirable to provide a DRAM structure and fabrication process that avoids these problems.

SUMMARY OF THE INVENTION

The present invention incorporates an oxide spacer along the sidewalls of the word line gate structure that increases the etch rate of the nitride liner layer relative to the etch rate of the gate cap nitride so that erosion of the gate cap nitride layer is reduced at the time the nitride liner layer is etched.

In accordance with an aspect of the invention, an etch rate of a nitride liner layer is improved relative to an etch rate of a further nitride liner layer. The nitride liner layer is located at least atop of an exposed portion of a substrate adjacent to a bottom of a stacked structure which is also located atop the substrate. The further nitride layer is located atop the stacked structure. An oxide spacer is formed along sidewalls of the stacked structure. The nitride liner layer is patterned and etched to form at least one opening therein to the substrate while the further nitride layer remains intact.

In accordance with a further aspect of the invention, a contact opening is formed in a semiconductor substrate. A stacked gate structure is formed atop a substrate and has a nitride cap layer as its uppermost layer. A nitride liner layer is formed at least atop an exposed portion of the substrate. An insulating layer is deposited atop the nitride liner layer between the stacked gate structure and a further stacked gate structure and is planarized. The insulating layer is patterned and etched to form at least one opening in the first insulating layer to the nitride liner layer. An oxide spacer is formed in the opening along sidewalls of the stacked gate structure. Exposed portions of the nitride liner layer that are beneath the opening of the insulating layer are etched to form at least one opening to the substrate while the nitride cap layer remains substantially intact.

In accordance with another aspect of the invention, a contact opening is formed in a semiconductor substrate. A stacked gate structure is formed atop a substrate and has a nitride cap layer as its uppermost layer. A nitride liner layer is formed at least atop an exposed portion of the substrate. An oxide spacer is formed along sidewalls of the stacked gate structure. An insulating layer is deposited atop the nitride liner layer between the stacked gate structure and a further stacked gate structure and is planarized. The insulating layer is patterned and etched to form at least one opening in the first insulating layer to the nitride liner layer. Exposed portions of the nitride liner layer that are beneath the opening of the insulating layer are etched to form at least one opening to the substrate while the nitride cap layer remains substantially intact.

According to yet another aspect of the invention, a contact opening is formed in a semiconductor device. A stacked gate structure is formed atop a substrate and has at least one conducting layer and a nitride cap layer that is formed atop the conducting layer as its uppermost layer. A nitride spacer is formed along sidewalls of the stacked gate structure. A nitride liner layer is formed atop an exposed portion of the substrate atop the stacked gate structure and along the nitride spacer. An oxide spacer is formed along a portion of the nitride liner layer that is adjacent to the nitride spacer. A first insulating layer is deposited atop the nitride liner layer between the stacked gate structure and a further stacked gate structure, and the first insulating layer is planarized. A further insulating layer is deposited atop the first insulating layer, and an anti-reflective coating (ARC) layer is deposited atop the further insulating layer. The anti-reflective coating is patterned and etched to form at least one opening in the ARC layer. Exposed portions of the further insulating layer that are beneath the opening in the ARC layer are etched to form at least one opening in the further insulating layer. Exposed portions of the first insulating layer that are beneath the opening in the further insulating layer are etched to form at least one opening in the first insulating layer. Exposed portions of the nitride liner layer that are beneath the opening in the first insulating layer are etched to form at least one opening to the substrate while the nitride cap layer remains substantially intact.

In accordance with a further aspect of the invention, a semiconductor device structure has at least one contact opening formed therein and has a structure as described above.

The foregoing aspects, features and advantages of the present invention will be further appreciated when considered with reference to the following description of the preferred embodiments and accompanying drawings.

DETAILED DESCRIPTION

Figure 1:
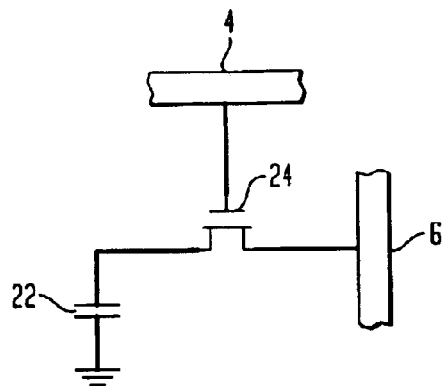
FIG. 1 is a schematic diagram showing a memory cell and the word line and bit line contacts.

FIG. 1 is a schematic diagram illustrating a known memory cell. The cell includes a charge storage capacitor 22 having one plate tied to a reference voltage, which is typically at ground or one-half of the bit line voltage, and having its other plate connected to the source of a pass transistor 24. The drain of the pass transistor 24 is connected to a bit line 6, and the gate of the pass transistor is coupled to the word line 4. Preferably, the charge storage capacitor 22 is formed within a deep trench (not shown), and the source of the pass transistor may likewise be formed in the deep trench. When planar transistors are used, the gate and drain regions are formed within the upper surface of the substrate. Alternatively, vertical transistors are used in which the gate of the pass transistor is formed within an upper region of the deep trench, and the drain region is typically formed in an upper portion of the substrate.

Figure 2A:
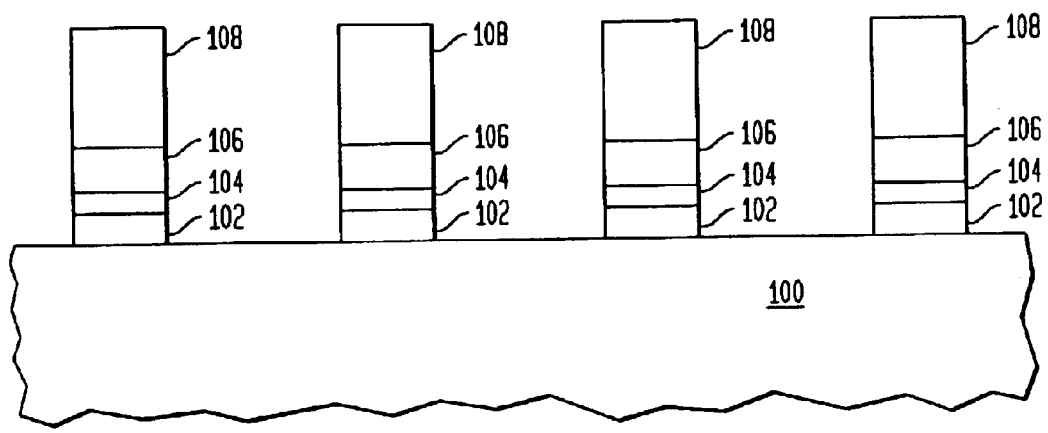
FIGS. 2A–2D are cross-sectional diagrams showing various steps in a known process for forming and etching the nitride liner layer.

FIGS. 2A–2D illustrate various steps that are part of a known process for forming a DRAM circuit. FIG. 2A illustrates a word line stack structure that is formed atop a semiconductor substrate 100 and contacts the gate of planar transistors (not shown). The word line stack structure typically includes one or more conductive layers, such as polysilicon layers 102 and 104, and at least one refractory metal layer 106, such as tungsten silicide (WSi). A layer of silicon nitride (SiN) 108, known as a gate cap layer, is formed atop the metal layer 106. The layers are deposited, patterned and etched in a known manner to form the word line stack structure shown. Then, an ion implant step may be carried out in the regions between the word line structures.

Figure 2B:
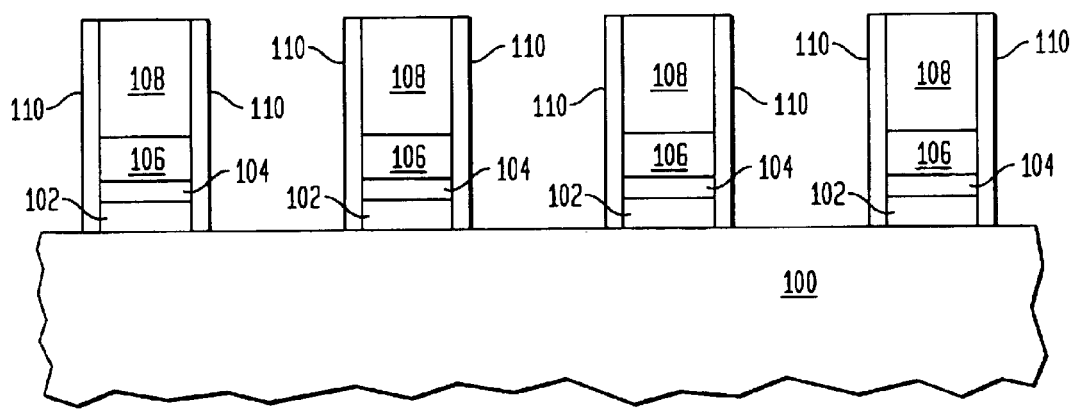

Then, as FIG. 2B shows, silicon nitride spacers 110 are formed on the sidewalls of the word line stacks, and a further ion implant may be carried out. The silicon nitride sidewall spacers 110 are formed in a known manner, typically by depositing silicon nitride atop the semiconductor substrate and atop of and along the sidewalls of the word line stacks and then anisotropically etching the silicon nitride from atop the word line stacks and the semiconductor substrate while leaving silicon nitride on the sidewalls of the word line stacks.

Figure 2C:
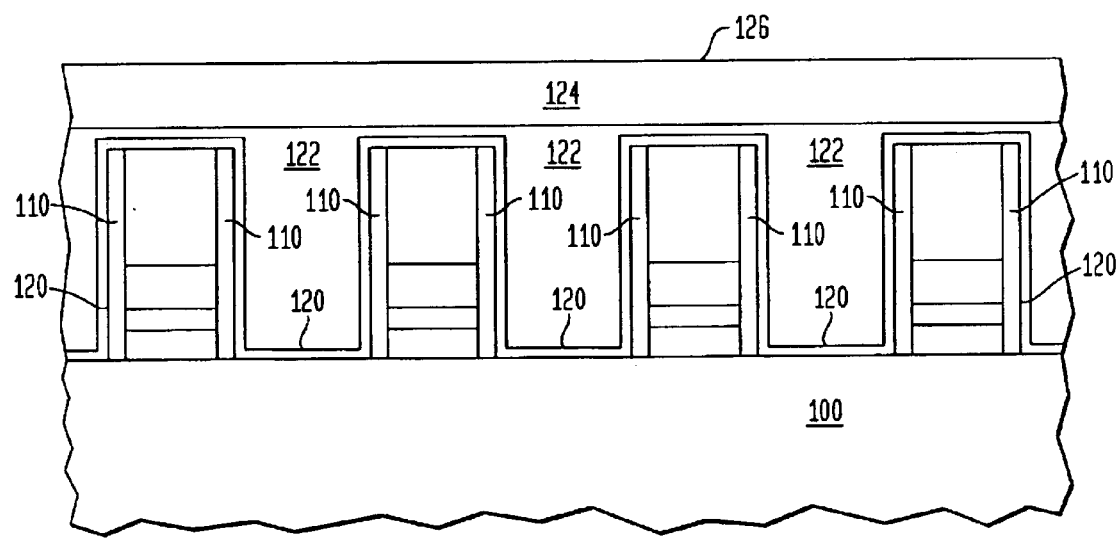

Next, as FIG. 2C shows, a silicon nitride liner layer 120 is deposited atop the semiconductor substrate, on the sidewall spacers and atop the word line gate stack. The region between the word line stacks is then filled with a doped oxide, such as BPSG, and the surface is planarized, such as by chemical mechanical polishing (CMP). An additional oxide layer 124, such as TEOS is then deposited.

Figure 2D:
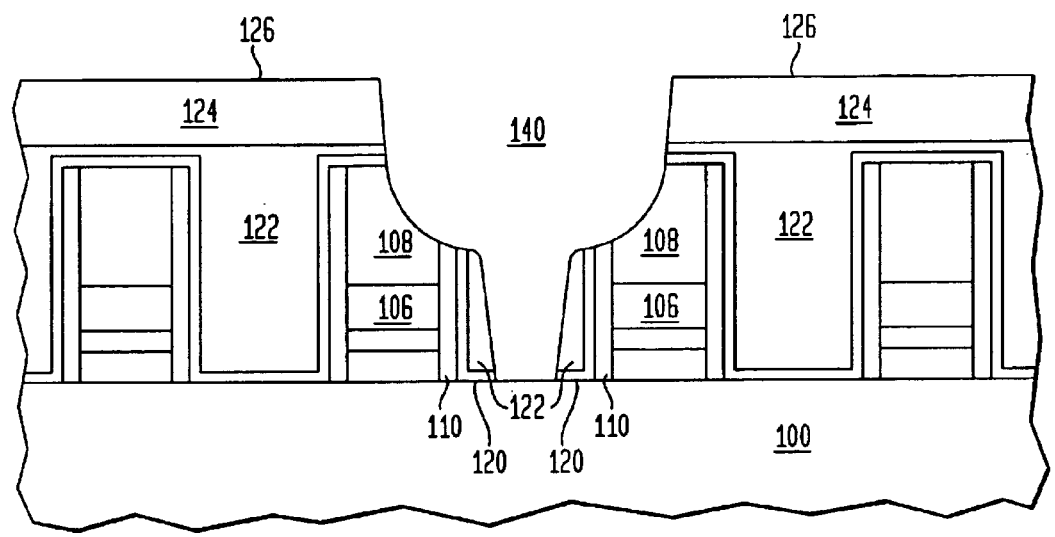

Then, an anti-reflective coating (ARC) layer and a photoresist layer (not shown) are deposited and patterned. The patterned layers are then used to mask an etching of the additional oxide layer 124 and the doped oxide layer 122. Then, the exposed portions of the silicon nitride liner layer 120 are etched to expose the regions of the semiconductor substrate that are to contact the bit lines. However, as FIG. 2D shows, the etching of the silicon nitride liner layer 120 also causes substantial erosion in the nitride gate cap layer 108. The erosion of the nitride gate cap layer 108 reduces the effective insulation between the conducting layers of the word line stack and the subsequently deposited bit line conducting layers and, possibly, creates an electrical short between the word line conductor and the bit line conductor when sufficient gate cap nitride is removed to expose the word line conductors. Though the silicon nitride liner layer typically has a thickness of about 100 Å and the gate cap nitride layer is substantially thicker than the silicon nitride liner layer, the etch rate of the gate cap nitride layer, which is located at the top of the word line stack, is disproportionately greater than the etch rate of the silicon nitride liner layer, which is located at the bottom of the bit line contact opening.

The present invention addresses the problem caused by the slower etch rate of the nitride liner layer located at the bottom of the bit line contact opening by incorporating an additional oxide spacer along the sidewalls of the word line stack. The presence of the oxide spacer increases the etch rate of the nitride liner layer so that substantially all of the nitride liner layer is removed from the bottom of the bit line contact opening without significant erosion of the gate cap nitride layer.

FIGS. 3A–3D illustrate an example of a process in accordance with the invention. Though a process for the manufacture of planar transistors is described herein, the invention is similarly applicable to processes for the manufacture of other devices, such as vertical, deep trench transistors.

Figure 3A:
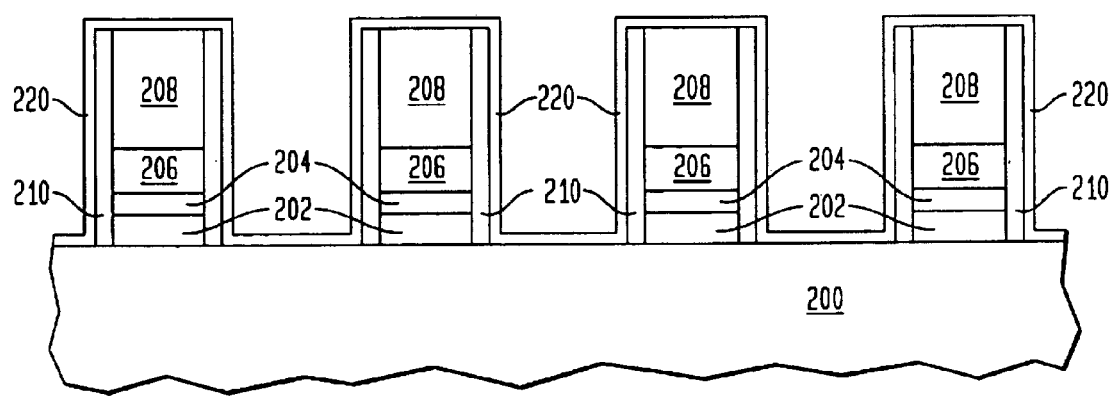
FIGS. 3A–3D are cross-sectional diagrams illustrating a portion of a DRAM at various steps in accordance with a process of the invention.

First, as FIG. 3A shows, a word line stack structure is formed in a known manner atop the gate regions. The word line stack comprises one or more polysilicon layers 202, 204 upon which is formed at least one refractory metal layer 206 and upon which, in turn, is formed a silicon nitride, or other nitride, gate cap layer 208. Then, silicon nitride, or other nitride, sidewall spacers 210 are formed in a known manner, and a silicon nitride, or other nitride, liner layer 220 is deposited atop of the gate cap nitride layer 208, along the sidewalls of the nitride spacers 210 and the semiconductor substrate 200. Ion implants into the semiconductor substrate 200 may be carried out before and/or after the formation of the nitride sidewall spacers 210.

Figure 3B:
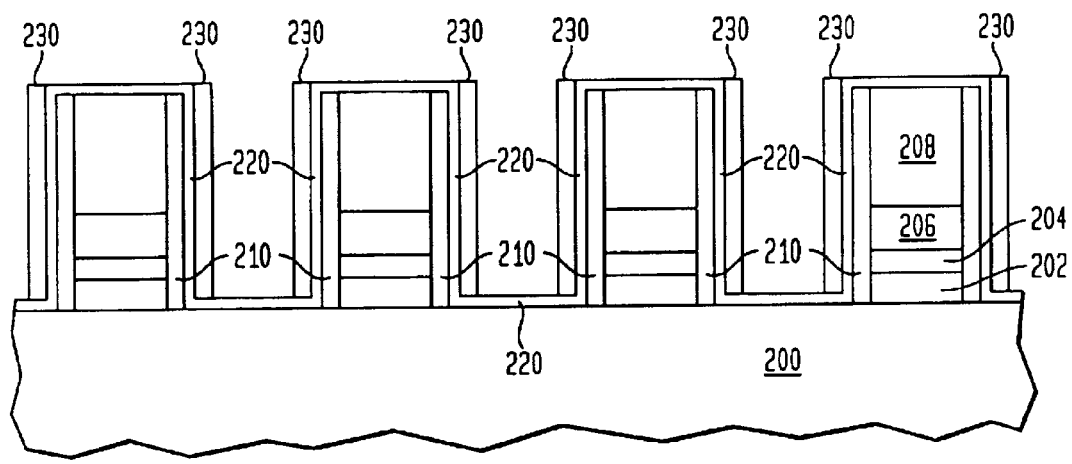

Next, in accordance with the invention, oxide sidewall spacers 230 are formed, as FIG. 3B shows. Typically, a layer of silicon dioxide, TEOS, or other oxide, is deposited atop the nitride liner layer 220, and then an anisotropic etch step is carried out to remove the oxide from atop the portions of the nitride liner layer that are atop the word line gate stack and atop the substrate, thereby leaving remaining vertical portions along the sides of the word line stack. The oxide spacers may alternatively be formed in another manner.

Figure 3C:
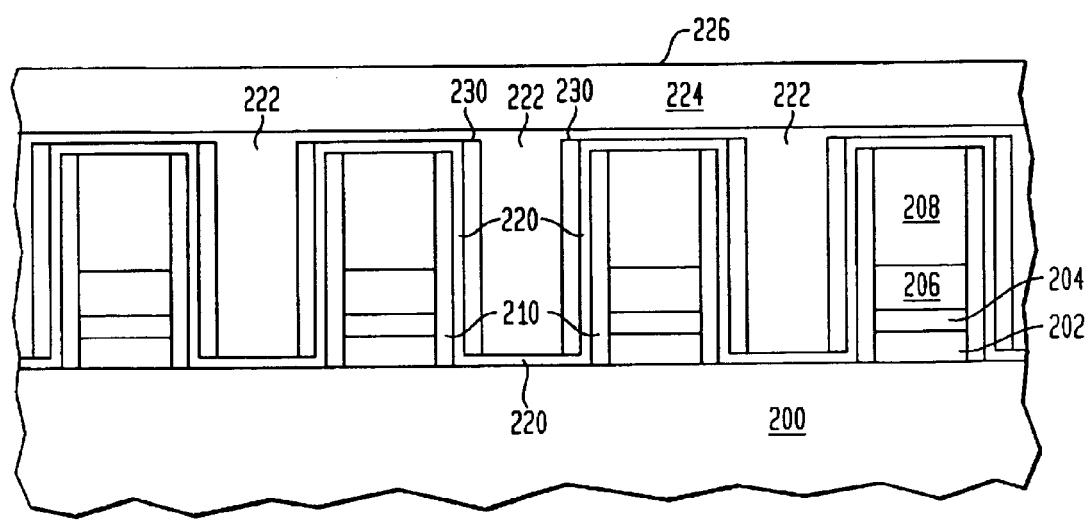

Next, as FIG. 3C shows, the regions between the word line stack structure are filled with a doped oxide 222, such as BPSG, the top surface of the doped oxide layer 222 is planarized, such as using CMP, and a further oxide layer 224, such as TEOS, is deposited. Then, an ARC layer (not shown) and a photoresist layer are deposited, patterned and etched, and the further oxide layer 224 and the doped oxide layer 222 are etched using the patterned ARC layer, and optionally the patterned photoresist layer, as an etch mask.

Figure 3D:
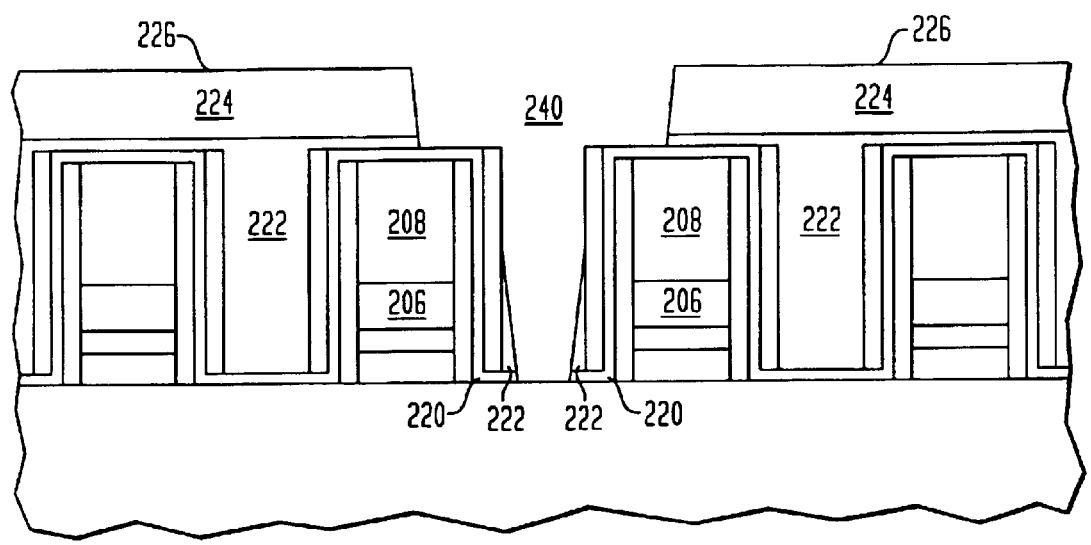

Thereafter, the portion of the nitride liner layer that is located at the bottom of the contact-to-bit line (CB) opening is etched. As FIG. 3D shows, the presence of the oxide sidewalls spacer 230 increases the etch rate of the portion of nitride liner layer that is located at the bottom of the CB opening. Typically, virtually all of the portion of the nitride liner layer located at the bottom of the CB opening is removed before there is any significant erosion of the gate cap nitride layer 208.

As an example, a 120 Å thick layer of silicon nitride is deposited as the nitride liner layer in the above process. A 75 Å thick protective oxide layer may be deposited before deposition of the silicon nitride liner layer.

Then, the oxide sidewall spacer is formed by first depositing a 100–200 Å TEOS layer atop the nitride liner layer in a 45 mTorr ozone atmosphere at 400° C. The layer is then etched using a reactive ion etch (RIE) process with, preferably, an oxide-to-oxide selectivity of 10:1, so that spacers are left only on the side walls. As an example, the RIE process is carried out using $C_4F_8$, supplied at a flow rate of 25 cc/min, CO, supplied at a flow rate of 300 cc/min, and Ar, supplied at a flow rate of 380 cc/min, at a chamber pressure of 42 mTorr and etched at 1700 W power and a temperature of 60° C.

Next, a 3000 Å thick layer of BPSG is deposited and planarized as described above, and a 4000 Å thick layer of TEOS and a 900 Å thick layer of ARC are deposited in the manner described above. The ARC is etched using a 60 second RIE step at 60° C., 120 W and 18 mTorr using reagent gases at flow rates of 20 cc/min $O_2$, 30 cc/min CO and 100 cc/min $N_2$. Next, a TEOS etch is carried out using 16 cc/min $C_4F_8$, 300 cc/min CO, 380 cc/min Ar and 5 cc/min $O_2$ at a pressure of 58 mTorr, 1700 W power, and a temperature of 60° C. for 60 seconds. Then, the BPSG is etched in an atmosphere of 7 cc/min $C_4F_8$, 4 cc/min $CH_2F_2$ and 600 cc/min Ar at a pressure of 55 mTorr and 1500 W power for 90 seconds at 60° C. The nitride liner layer, and part of the oxide spacer, is then etched in an atmosphere of 25 cc/min $CHF_3$ and 40 cc/min $O_2$ at a pressure of 40 mT and 120 W power for 15 seconds. Thereafter, the remaining oxide is etched in an atmosphere of 10 cc/min $CHF_3$ and 45 cc/min $O_2$ at a pressure of 150 mTorr and at 80 W power for 16 seconds.

Figure 4A:
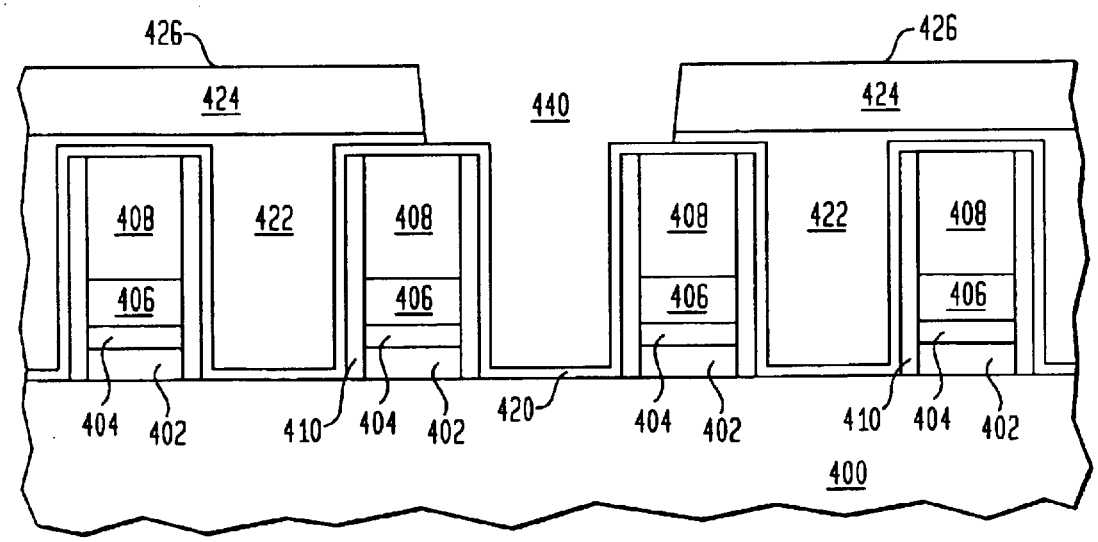
FIGS. 4A–4C are cross-sectioned diagrams showing a portion of a DRAM at various steps in accordance with another process of the invention.
Figure 4B:
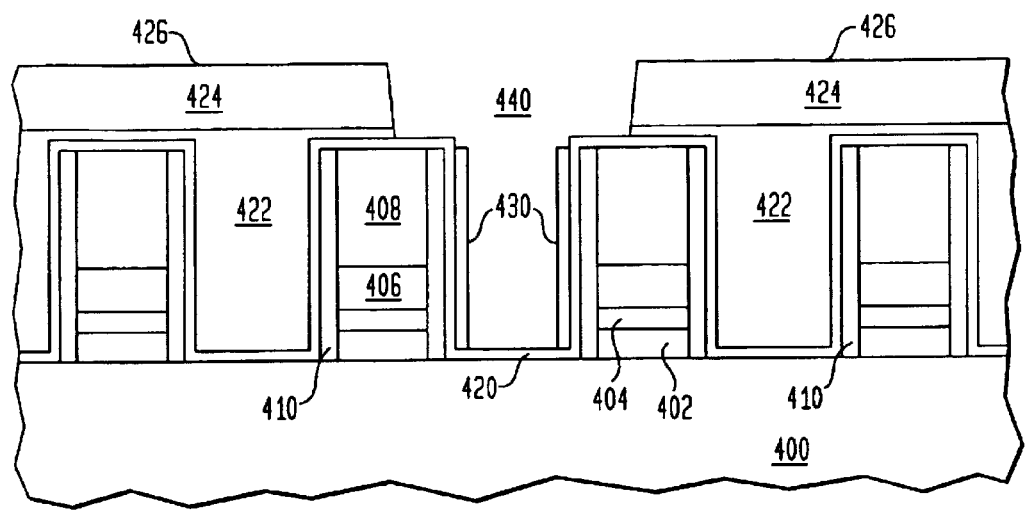
Figure 4C:
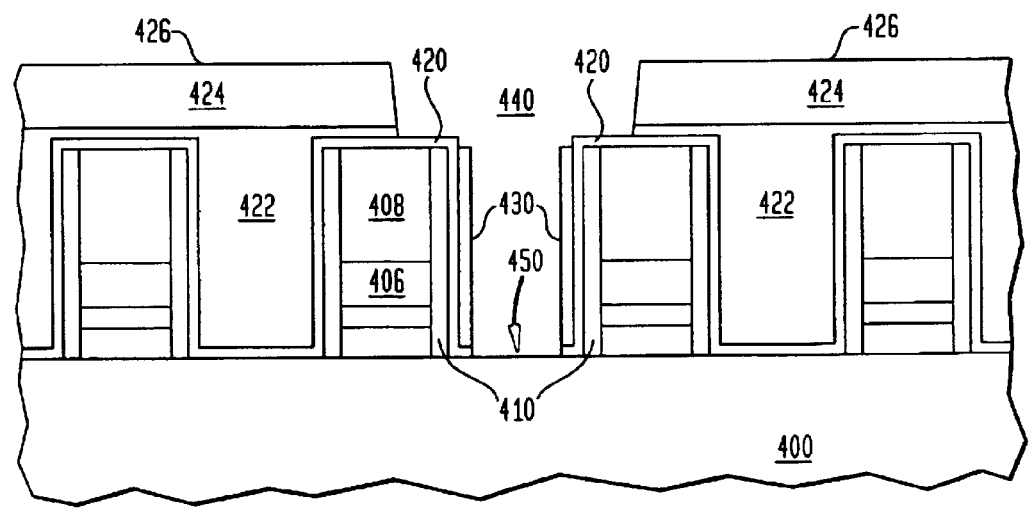

FIGS. 4A–4C illustrate another example of a process in accordance with the invention. The initial steps of the process up to, and including, the patterning and etching of the additional oxide layer and the doped oxide layer are the same as those described above with reference to FIGS. 2A–2C. However, before the nitride liner layer is etched, oxide sidewall spacers are formed. The oxide spacers increase the etch rate of the nitride liner layer so that substantially all of the nitride liner layer from the bottom of the bit line contact opening is removed without significantly eroding the gate cap nitride layer.

First, as FIG. 4A shows, a word line stack, which is comprised of one or more polysilicon layers 202, 204, at least one refractory metal layer 406, and a silicon nitride, or other nitride, gate cap layer 408, are formed. Silicon nitride, or other nitride, sidewall spacers 410 are then formed, and a silicon nitride, or other nitride, liner layer 420 is deposited. Then, the regions between the word line gate stack structure are filled with a BPSG layer 422, or other doped oxide layer, and planarized, and then a further oxide layer 424, such as TEOS, and an ARC layer (not shown) are deposited. The ARC layer, further oxide layer, and doped oxide layer are then patterned and etched, as described above, to form CB openings to the nitride liner layer 420. Then, as shown in FIG. 4B, oxide sidewall spacers 430 are formed by depositing a layer of oxide on all exposed surfaces and then anisotropically etching the oxide to leave only the spacers.

Thereafter, as FIG. 4C shows, the nitride liner layer at the bottom of the opening is etched. Essentially all of the portion of the nitride liner layer present at the bottom of the opening is removed before there is any significant erosion in the gate cap nitride layer because the oxide sidewall spacers 430 increase the etch rate of the nitride liner layer at the bottom of the opening.

As an example, the definition and etching steps are carried out using the same conditions described with reference to the above example.

Advantageously, the etch rate of the silicon nitride liner layer at the bottom of the CB opening is greatly increased, thereby reducing the time required to form the CB opening while substantially maintaining the integrity of the gate cap nitride layer. As a result, greater effective insulation is provided between the word line and the bit line and word line-to-bit line electrical shorts are avoided.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of improving an etch rate of a first portion of a nitride liner layer relative to an etch rate of a further portion of said nitride liner layer, said first portion of said nitride liner layer being located at least atop an exposed portion of a substrate adjacent to a bottom of at least one stacked structure also located atop said substrate, said further portion of said nitride linear layer being located atop said stacked structure; said method comprising:

forming a nitride spacer along the sidewalls of said stacked structure;

forming said nitride liner layer over said substrate, said stacked structure, and said nitride spacer;

depositing a first insulating layer atop said nitride liner layer at least between two stacked structures and planarizing said first insulating layer;

depositing a further insulating layer atop said planarized first insulating layer, said first planarized insulation and said further insulating layer being patterned and selectively atched to form at least one opening to expose said first, said further and another portion of said nitride liner layer, said selective etching leaving said exposed portions of said nitride liner layer intact so that said stacked structures are not exposed;

forming an oxide spacer along said exposed another portion of said nitride liner layer, said another portion being formed along said nitride spacer disposed along sidewalls of said stacked structure; and etching said exposed first portion of said nitride liner layer to form at least one opening therein to said substrate, said further portion of said nitride liner layer remaining substantially intact such that said stacked structure is not exposed.

2. The method of claim 1 wherein said oxide spacer comprises TEOS.

3. The method of claim 1 further comprising depositing an anti-reflective coating (ARC) layer atop said further insulating layer prior to forming said oxide spacer.

4. The method of claim 3 wherein said selective etching comprising patterning and etching said anti-reflective coating (ARC) layer to form at least one opening in said ARC layer, etching exposed portions of said further insulating layer that are beneath said opening in said ARC layer to form at least one opening in said further insulating layer, and etching exposed portions of said first insulating layer that are beneath said opening in said further insulating layer to form at least one opening in said first insulating layer prior to forming said oxide spacer.

5. A method of forming a contact opening in a semiconductor device; said method comprising:

forming a stacked gate structure atop a substrate, said stacked gate structure having a nitride cap layer as its uppermost layer;

forming a nitride spacer along sidewalls of said stacked gate structure;

forming a nitride liner layer at least atop an exposed portion of said substrate, atop said stacked gate structure and along said nitride spacer;

depositing and planarizing a first insulating layer atop said nitride liner layer between said stacked gate structure and a further stacked gate structure;

patterning and selectively etching said first insulating layer to form at least one opening in said first insulating layer to expose portions of said nitride liner layer said selective etching leaving said exposed portions of said nitride liner layer intact so that said stacked gate structure is not exposed;

forming an oxide spacer in said at least one opening along a portion of said nitride liner layer that is adjacent to said nitride spacer formed along said sidewalls of said stacked gate structure; and etching exposed portions of said nitride liner layer that are beneath said opening in said first insulating layer to form at least one opening to said substrate while said further nitride cap layer remains substantially intact.

6. The method of claim 5 wherein said stacked gate structure includes at least one conducting layer, and said nitride cap layer is formed atop said conducting layer.

7. The method of claim 5 wherein said oxide spacer comprises TEOS.

8. The method of claim 5 wherein said step of forming said oxide spacer comprises: depositing an oxide layer, and anisotropically etching portions of said oxide layer that are atop said nitride liner layer and atop said stacked gate structure.

9. The method of claim 5 wherein said first insulating layer comprises a doped oxide.

10. The method of claim 5 wherein said first insulating layer comprises BPSG.

11. The method of claim 5 further comprising depositing a further insulating layer atop said first insulating layer, and wherein said selective etching to form an opening includes etching through said further insulating layer.

12. The method of claim 11 further comprising depositing an anti-reflective coating (ARC) layer atop said further insulating layer.

13. The method of claim 12 wherein said patterning and selective etching step comprises patterning and etching said anti-reflective coating (ARC) layer to form at least one opening in said ARC layer, etching exposed portions of said further insulating layer that are beneath said opening in said ARC layer to form at least one opening in said further insulating layer, and etching exposed portions of said first insulating layer that are beneath said opening in said further insulating layer to form at least one opening in said first insulating layer.

14. The method of claim 11 wherein said further insulating layer comprises TEOS.

15. A method of forming a contact opening in a semiconductor device; said method comprising:

forming a stacked gate structure atop a substrate, said stacked gate structure having at least one conducting layer and having a nitride cap layer formed atop said conducting layer as its uppermost layer;

forming a nitride spacer along sidewalls of said stacked gate structure;

forming a nitride liner layer atop an exposed portion of said substrate, atop said stacked gate structure and along said nitride spacer;

depositing a first insulating layer atop said nitride liner layer between said stacked gate structure and a further stacked gate structure;

planarizing said first insulating layer;

depositing a further insulating layer atop said first insulating layer;

depositing an anti-reflective coating (ARC) layer atop said further insulating layer;

patterning and etching said ARC layer to form at least one opening in said ARC layer;

etching exposed portions of said further insulating layer that are beneath said opening in said ARC layer to form at least one opening in said further insulating layer;

etching exposed portions of said first insulating layer that are beneath said opening in said further insulating layer to form at least one opening in said first insulating layer to expose portions of said nitride liner layer, said etching steps leaving said exposed portions of nitride liner layer intact so that said stacked gate structure is not exposed;

forming an oxide spacer in said opening along a portion of said nitride liner layer that is adjacent to said nitride spacer formed along said sidewalls of said stacked gate structure; and etching exposed portions of said nitride liner layer that are beneath said opening in said first insulating layer to form at least one opening to said substrate while said nitride cap layer remains substantially intact.

* * * * *

UNITED STATES PATENT AND TRADEMARK OFFICE
CERTIFICATE OF CORRECTION

PATENT NO. : 6,960,523 B2
DATED : November 1, 2005
INVENTOR(S) : Maldei et al.

It is certified that error appears in the above-identified patent and that said Letters Patent is hereby corrected as shown below:

Title page,
Item [75], Inventors, Rajesh Rengarajan's city "Poughkeepsie" should be
-- Wappingers Falls --.

Column 6,
Line 57, delete "linear" and insert -- liner --.
Line 64, insert -- gate -- between "stacked" and "structures".

Column 7,
Line 2, delete "atched" and insert -- etched --.

Signed and Sealed this

Twenty-fourth Day of January, 2006

JON W. DUDAS
*Director of the United States Patent and Trademark Office*